United States Patent [19]

Sato

[11] Patent Number: 4,651,034
[45] Date of Patent: Mar. 17, 1987

[54] ANALOG INPUT CIRCUIT WITH COMBINATION SAMPLE AND HOLD AND FILTER

[75] Inventor: Hiroshi Sato, Akashi, Japan

[73] Assignee: Mitsubishi Denki Kabushiki Kaisha, Tokyo, Japan

[21] Appl. No.: 666,957

[22] PCT Filed: Apr. 4, 1984

[86] PCT No.: PCT/JP84/00169
§ 371 Date: Oct. 16, 1984
§ 102(e) Date: Oct. 16, 1984

[87] PCT Pub. No.: WO85/04750
PCT Pub. Date: Oct. 24, 1985

[30] Foreign Application Priority Data

Nov. 26, 1982 [JP] Japan ................. 57-208217

[51] Int. Cl.$^4$ ............... H03K 17/26; H03K 17/60
[52] U.S. Cl. ......................... 307/556; 307/352; 307/543; 328/167; 328/151
[58] Field of Search ............. 307/556, 543, 352, 353; 328/127, 167, 151

[56] References Cited

U.S. PATENT DOCUMENTS 3,838,346  9/1974  Cox ........................... 328/151
3,839,650 10/1974  Wood ......................... 307/246
4,063,182 12/1977  Besson ....................... 328/151
4,199,697  4/1980  Edwards ...................... 307/352

OTHER PUBLICATIONS

Association for the Promotion of Japanese Electronics Industries, "Analog IC Applications Handbook", 10-9-76.

Primary Examiner—Stanely D. Miller
Assistant Examiner—Richard Roseen
Attorney, Agent, or Firm—Wenderoth, Lind & Ponack

[57] ABSTRACT

An analog input circuit, which samples and holds predetermined components sampled from input signals, has a filter and a sample and hold circuit which are formed as a unitary structure to simplify the circuit structure. For this purpose, the operational amplifier of the filter is constituted by two stages of voltage-follower circuits that are connected in series via a switch, and a holding capacitor is connected to the the switch. When the switch is closed, the holding capacitor assumes the same potential as the output of the filter and when the switch is opened, the holding capacitor maintains the output voltage of the filter.

4 Claims, 6 Drawing Figures

ANALOG INPUT CIRCUIT WITH COMBINATION SAMPLE AND HOLD AND FILTER

FIELD OF THE INVENTION

The present invention relates to an analog input circuit which samples and holds predetermined components extracted from input signals.

DESCRIPTION OF THE PRIOR ART

A conventional circuit of this type is represented by an analog input circuit shown in FIG. 1 which is used for digital protective relays. In FIG. 1, reference numerals 1a to 1h denote filters for removing noise components that are undesirable for relay judgement; numerals 2a to 2h denote sample and hold circuits which are provided for the filters 1a to 1h, and which effect the sampling simultaneously; numeral 3 denotes an analog-to-digital converter circuit, and numeral 4 denotes a multiplexer for selecting the input for the analog-to-digital converter circuit. Symbols (a) to (h) denote analog input signals, and symbol (p) denotes a digital output signal. The analog input signals (a) to (h) may be signals from various systems such as detection transformers and detection current transformers utilized in a power system, and which are subjected to a level conversion, current and voltage conversion, and waveform shaping.

The operation will be described below. Voltage or current wave-forms introduced from a system contain DC components or harmonic components produce errors in determining whether or not an accident in the system being monitored has developed. Therefore, only required components are extracted through the filters 1a to 1h, and are held simultaneously by the sample and hold circuits 2a to 2h. The voltage levels which were just present are produced by the sample and hold circuits 2a to 2h for only a predetermined period of time. The multiplexer 4 successively scans these channels and connects them to the analog-to-digital converter circuit 3. A series of operations is initiated in the holding condition of the sample and hold circuits 2a to 2h, and the channels are connected to the analog-to-digital converter circuit 3 as they are scanned successively in a time-sharing manner. This operation is complete at the moment when all of the signals of the respective channels have been converted into digital signals in a time sharing manner.

The conventional analog input circuit has been constructed as described above. Therefore, if the number of channels increases, the numbers of filters and sample and hold circuits increase correspondingly, resulting in an increase in the number of parts. In most cases, furthermore, the filters and sample and hold circuits are provided with circuits for adjusting their offset and gain depending upon the amplitude of the input analog signals. Therefore, these adjusting functions are often provided in a duplicated manner.

SUMMARY OF THE INVENTION

The present invention provides an analog input circuit which employs two stages of voltage-follower circuits connected in series via a switch are used as an operational amplifier to adjust the quality factor Q of an active filter, wherein a holding capacitor is provided at the output terminal of the switch, and wherein the holding capacitor assumes the same potential as the output of the active filter when the switch is closed and when the switch is opened, the holding capacitor maintains the output voltage of the active filter.

According to the analog input circuit of the present invention, two stages of voltage-follower circuits are utilized both as an operational amplifier for the sample and hold circuits and as an operational amplifier for the filters. Therefore, the number of parts can be decreased, and the adjusting functions are not duplicated, and the manufacturing cost can be reduced, and space can be saved, and reliability can be increased.

DESCRIPTION OF THE PREFERRED EMBODIMENTS

Figure 1:
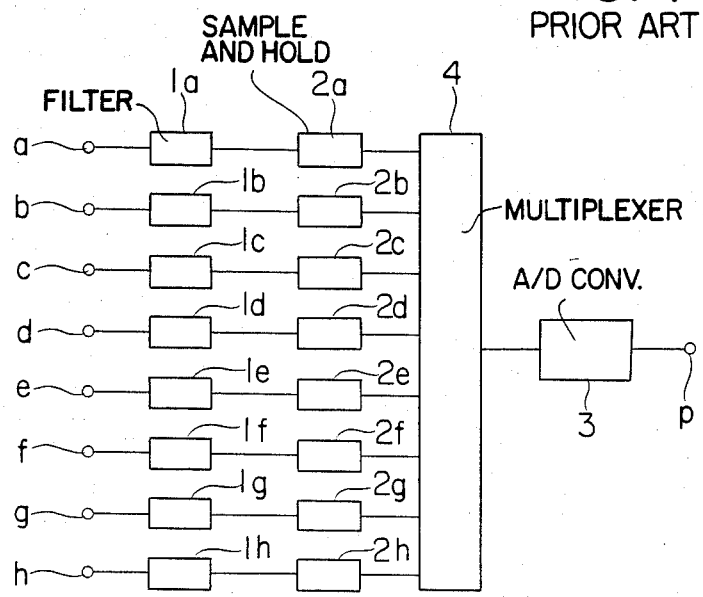
FIG. 1 is a block diagram of a conventional analog input circuit adapted to digital protective relays.
Figure 2:
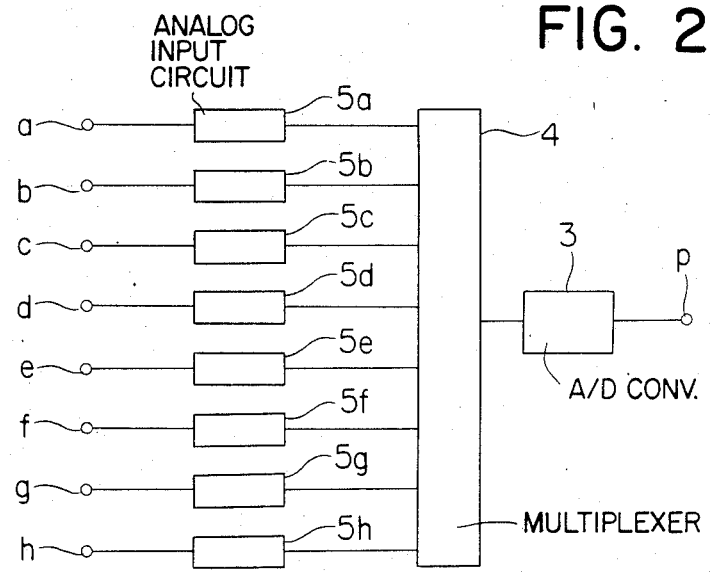
FIG. 2 is a block diagram of an analog input circuit according to an embodiment of the present invention which is adapted to a digital relay.
Figure 3:
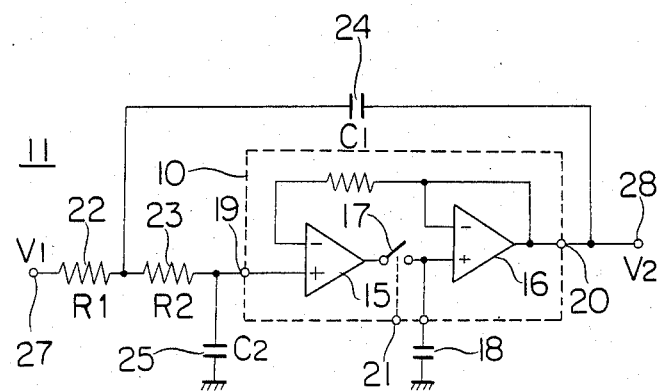
FIG. 3 is a diagram showing the structure of the analog input circuit of FIG. 2.
Figure 4:
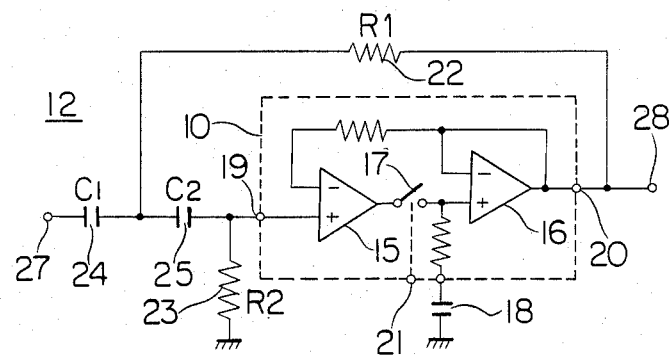
FIGS. 4 and 5 are diagrams showing structures of analog input circuits according to other embodiments of the present invention.
Figure 5:
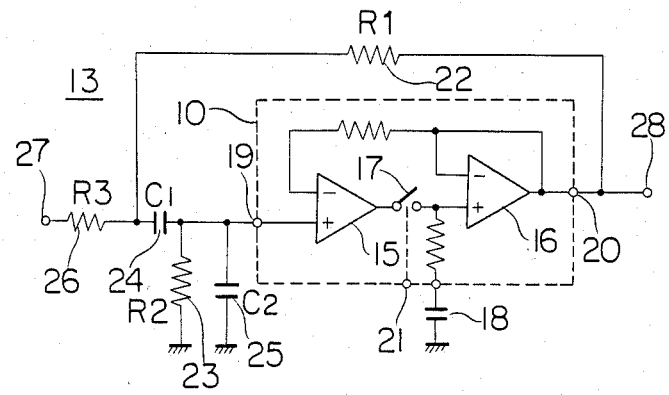
Figure 6:
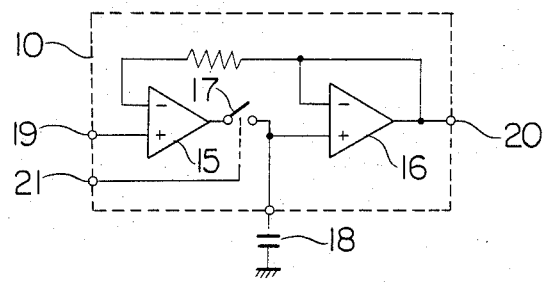
FIG. 6 is a diagram of a sample and hold circuit which constitutes a portion of the analog input circuit of FIG. 5.

Embodiments of the invention will be described below in conjunction with the drawings. FIG. 2 is a block diagram of an analog input circuit according to an embodiment of the present invention which is adapted to a digital protective relay. In FIG. 2, the same reference numerals as those of FIG. 1 denote the same or corresponding portions, and are not repeatedly explained here. Reference numverals 5a–5h denote analog input circuits each consisting of a filter circuit and a sample and hold circuit as a unitary structure; numeral 4 denotes a multiplexer, and numeral 3 denotes an analog-to-digital converter circuit. The analog input circuits 5a–5h may be of the low-pass type, high-pass type and band-pass type. FIGS. 3, 4 and 5 illustrate specific embodiments of the analog input circuits, and FIG. 6 illustrates a specific embodiment of the sample and hold circuits provided in the analog input circuits 5a–5h.

Prior to explaining the operation of the embodiments of the invention, the sample and hold circuit 10 is explained below in conjunction with FIG. 6, in which reference numerals 15 and 16 denote operational amplifiers; numeral 17 denotes a switch; numeral 18 denotes a holding capacitor; numeral 19 denotes an input terminal; numeral 20 denotes an output terminal, and numeral 21 denotes a control signal input terminal (hereinafter abbreviated as S/H terminal) for controlling the opening or closing of the switch 17.

Now assuming that a control signal is supplied to the S/H terminal, the switch 17 is closed. The sample and hold circuit 10 as a whole consists of two stages of voltage-follower circuits connected in series. If viewed from the external side, therefore, the sample and hold circuit 10 appears as a non-inverting operational amplifier, and the holding capacitor 18 assumes the same potential as the input terminal 19 and the output terminal 20. On the other hand, when the supply of the control signal is discontinued so that the switch 17 is opened, the potential of the holding capacitor 18 is applied to the input terminal of the operational amplifier 16 and an output value just before the switch 17 opens is maintained. Therefore, even when the potential changes at the input terminal 19, the potential of the holding capacitor 18 is maintained at the output terminal 20. Hereinafter, the condition where the switch 17 is closed is referred to as a sampling mode, and the condition where the switch 17 is opened is referred to as a holding mode.

As described below, the operational amplifiers used in the sample and hold circuit 10 may also be used as the operational amplifiers for the filter circuit, thus performing two different functions with the same amplifiers so as to minimize the number of circuit components. FIG. 3 shows an embodiment of an analog input circuit in which a filter 11 of the low-pass type is constituted by adapting the sample and hold circuit 10 shown in FIG. 6. In FIG. 3, reference numeral 10 denotes the sample and hold circuit; numerals 22 and 23 denote resistors for the filter; numerals 24 and 25 denote capacitors of the filter; numeral 18 denotes a holding capacitor; numeral 27 denotes an input terminal, and numeral 28 denotes an output terminal.

In FIG. 3, if the sample and hold circuit 10 is regarded as an operational amplifier which is connected in a non-inverting manner, the relationship between the input terminal 27 and the output terminal 28 can be expressed by the following equation (1), $$\frac{V_2}{V_1} = \frac{\frac{1}{R_1R_2C_1C_2}}{S^2 + S\left(\frac{1}{R_1C_1} + \frac{1}{R_2C_1}\right) + \frac{1}{R_1R_2C_1C_2}} \quad (1)$$

where
$V_1$ denotes a potential at the input terminal 27,
$V_2$ denotes a potential at the output terminal 28, and
$S$ denotes $j\omega$, i.e., denotes a variable expressed as $2\pi \times$ frequency.

The relationship between the analog signal voltage $V_2$ and the analog signal voltage $V_1$ given by the above equation (1) changes with changes in S. Namely, $V_2/V_1 = 1$ when $S=0$, and $V_2/V_1 = 0$ when $S=\infty$. Therefore, the analog input circuit works as a sample and hold circuit and also as a filter of the low-pass type. That is, the analog input circuit works as a filter of the low-pass type in the sampling mode. The equation (1) is the same as that of an active filter that is realized by using a non-inverting amplifier of which the operation has been widely known. When the holding mode is assumed, the output potential present just before the holding mode is switched is maintained as described earlier in the operation of the sampling mode. This output signal is produced when the filter is working in the sampling mode. Therefore, the analog input signal wave-form having no undesired components, is held. The output impedance of the sample and hold circuit 10 is so small that the potential change at the input terminal through the capacitor 24 can be neglected.

In the holding mode, the feedback loop through the capacitor 24 is opened. Therefore, to the input terminal 19 of the sample and hold circuit 10 is applied a potential from which high-frequency components have been removed by a different filter of the low-pass type constituted by the resistors 22 and 23 and the capacitor 25. When the circuit is switched into the sampling mode, the filter changes into the previously described filter of the low-pass type.

As described above, the operational amplifier in the sample and hold circuit 10 works as an operational amplifier for the active filter in the sampling mode, and also works as an operational amplifier for the sample and hold circuit in the holding mode.

FIGS. 4 and 5 illustrate other embodiments of the present invention, i.e., illustrate concrete structure of analog input circuits which constitute a high-pass filter 12 and a band-pass filter 13, respectively, by utilizing the sample and hold circuit 10. In these drawings, the same reference numerals as those of FIG. 3 denote the same or corresponding portions, and are not repeatedly described here. In the embodiment of FIG. 4, the high-pass filter consists of resistors 22 and 23 and capacitors 24 and 25, and works as an active filter together with the operational amplifier in the sample and hold circuit 10 in the same manner as in the embodiment of FIG. 3. In the embodiment of FIG. 5, also, the band-pass filter consists of resistors 22 and 23 and capacitors 24 and 25, and works as an active filter together with the operational amplifier in the sample and hold circuit 10 in the same manner as in the embodiment of FIG. 3.

According to the present invention as described above, the active filter and the sample and hold circuit are constituted as a unitary structure, and no operational amplifier is required for the filter circuit. Therefore, the manufacturing cost can be reduced, and space can be saved, and reliability is improved, and the consumption of electric power is reduced. In the sample and hold circuit, two stages of voltage-follower circuits are connected in series in the sampling mode. Therefore, the input circuit exhibits a very high input impedance, making it possible to use resistors having large resistances to constitute the active filter. Therefore, when a time constant of resistors and capacitors is to be set, the capacitances of the capacitors can be reduced, presenting an advantage from the standpoint of manufacturing cost and space.

Industrial Applicability

The present invention is not limited to the analog input circuit for the digital protective relays only but can also be adapted to digital devices, in general, which receive analog signals.

What is claimed is:

1. An analog input circuit comprising:
   an impedance network comprising a plurality of impedances and having an input and an output terminal and an intermediate terminal, said input terminal of said network being an input terminal of said analog input circuit;
   first and second voltage follower stages, an input of said first stage connected to said output terminal, and said stages connected in cascade via a switch disposed between an output of said first stage and an input of said second stage;
   a holding capacitor connected to said input of said second stage so as to assume the potential of said output of said first stage when said switch is closed and so as to maintain the potential at said input of said second stage at a constant value when said switch is opened, said constant value being equal to the potential of said output of said first stage immediately prior to said switch being opened;
   a feedback impedance connected between an output of said second stage and said intermediate terminal of said impedance network, said output of said second stage being an output terminal of said analog input circuit;

wherein said impedance network and feedback impedance and first and second follower stages form an active filter when said switch is closed; and wherein said second follower stage and holding capacitor form a holding portion of a sample and hold circuit when said switch is open.

2. A circuit as recited in claim 1, wherein said impedance network and feedback impedance are arranged such that said active filter is a low-pass filter.

3. A circuit as recited in claim 1, wherein said impedance network and feedback impedance are arranged such that said active filter is a high-pass filter.

4. A circuit as recited in claim 1, wherein said impedance network and feedback impedance are arranged such that said active filter is a band-pass filter.

* * * * *